United States Patent
Butler et al.

(10) Patent No.: US 8,243,258 B2
(45) Date of Patent: Aug. 14, 2012

(54) LITHOGRAPHIC APPARATUS HAVING ACOUSTIC RESONATOR

(75) Inventors: Hans Butler, Best (NL); Marc Wilhelmus Maria Van Der Wijst, Veldhoven (NL); Johan Hendrik Geerke, Eindhoven (NL); Joost De Pee, Veldhoven (NL); Clementius Andreas Johannes Beijers, Eindhoven (NL); Marco Hendrikus Hermanus Oude Nijhuis, Eindhoven (NL); Francois Xavier Debiesme, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 855 days.

(21) Appl. No.: 12/276,115

(22) Filed: Nov. 21, 2008

(65) Prior Publication Data

US 2009/0161085 A1 Jun. 25, 2009

Related U.S. Application Data

(60) Provisional application No. 60/996,828, filed on Dec. 6, 2007.

(51) Int. Cl.
- G03B 27/42 (2006.01)
- E04B 1/82 (2006.01)
- G02B 7/02 (2006.01)

(52) U.S. Cl. ............... 355/53; 181/286; 359/819

(58) Field of Classification Search .......... 181/286; 355/30, 53, 75; 359/819
See application file for complete search history.

(56) References Cited

U.S. PATENT DOCUMENTS

| | | | | |
|---|---|---|---|---|
| 4,690,528 A | * | 9/1987 | Tanimoto et al. | 353/101 |
| 5,598,479 A | * | 1/1997 | Dodt et al. | 381/71.7 |
| 6,002,987 A | * | 12/1999 | Kamiya et al. | 702/56 |
| 6,665,046 B2 | * | 12/2003 | Nogawa et al. | 355/30 |
| 6,897,599 B2 | * | 5/2005 | Sorg et al. | 310/326 |
| 2003/0197849 A1 | * | 10/2003 | Ishikawa et al. | 355/69 |
| 2005/0161280 A1 | * | 7/2005 | Furuya | 181/225 |

FOREIGN PATENT DOCUMENTS

| | | |
|---|---|---|
| JP | 62-090914 | 4/1987 |
| JP | 7-508357 T | 9/1995 |
| JP | 9-198052 | 7/1997 |
| JP | 9260279 | 10/1997 |
| JP | 9265137 | 10/1997 |
| JP | 9-291812 | 11/1997 |
| JP | 10-275767 | 10/1998 |
| JP | 11-135422 A | 5/1999 |

(Continued)

OTHER PUBLICATIONS

Notice of Reasons for Rejection in related Japanese Application No. 2008-303286 mailed Apr. 18, 2011.
Japanese Office Action mailed Mar. 2, 2012 in corresponding Japanese Patent Application No. 2008-303286.

*Primary Examiner* — Hung Henry Nguyen
*Assistant Examiner* — Steven H Whitesell Gordon
(74) *Attorney, Agent, or Firm* — Pillsbury Winthrop Shaw Pittman LLP (57) ABSTRACT

A lithographic apparatus may be provided with an acoustic resonator to dampen an acoustic vibration in the lithographic apparatus. The acoustic resonator may include a Helmholtz resonator. The helmholz resonator may be provided with an active element to provide active damping and/or altering a spring characteristic of the mass spring assembly formed by the resonator. The resonator may be provided at a slit in a shield between the patterning device stage and the projection system to suppress transfer of acoustical vibrations, caused by e.g. a movement of the patterning device stage, to the projection system.

25 Claims, 3 Drawing Sheets

FOREIGN PATENT DOCUMENTS

| | | |
|---|---|---|
| JP | 3-057416 U | 6/1999 |
| JP | 2002-132265 A | 5/2002 |
| JP | 2002-329771 A | 11/2002 |
| JP | 200328856 | 1/2003 |
| JP | 2003-130350 | 5/2003 |
| JP | 200778322 | 3/2007 |

* cited by examiner

LITHOGRAPHIC APPARATUS HAVING ACOUSTIC RESONATOR

CROSS-REFERENCE TO RELATED APPLICATIONS

This application claims priority and benefit to U.S. Provisional Patent Application Ser. No. 60/996,828, entitled "LITHOGRAPHIC APPARATUS HAVING ACOUSTIC RESONATOR", filed on Dec. 6, 2007. The content of that application is incorporated herein in its entirety by reference.

FIELD

The invention relates to a lithographic apparatus arranged to transfer a pattern from a patterning device onto a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

At present, several trends may be observed in lithography. Firstly, increasing throughputs requirements of the lithographic apparatus are observed to allow the lithographic apparatus to process e.g. a larger quantity of wafers within a certain time period.

Secondly, accuracy requirements tend to be increased, which, in combination with an enhanced capability to project more detailed, i.e. finer patterns on to the substrate, allows manufacturing of substrates having more detailed patterns. As a consequence of the increased throughput, moving parts in the lithographic apparatus tend to be moving at higher speed and with higher accelerations. Thereby, disturbances caused by such movements such as acoustic vibrations, tend to increase. Secondly, because of increased accuracy requirements, a sensitivity of parts of the lithographic apparatus to such acoustic vibrations, tend to increase, at least relative to an imaging accuracy. Furthermore, in a lithographic apparatus, many other sources of acoustic vibration may be present, e.g. moving elements of the lithographic apparatus, gas ducts to provide a clean or cleaned gas mixture, cooling devices, fans, etc. Acoustic vibrations by any such source, or by any other source, may have an effect on a part of the lithographic apparatus, such as, however not limited to the projection system, lens element or mirror element of the projection system, position sensor of a support position measurement system or substrate table position measurement system, an alignment system, or any other part of the lithographic apparatus.

SUMMARY

It is desirable to reduce a possible effect of an acoustic vibration on a part of the lithographic apparatus, to thereby allow an increase in accuracy, overlay or any other parameter of the lithographic apparatus.

According to an embodiment of the invention, there is provided a lithographic apparatus arranged to transfer a pattern from a patterning device onto a substrate, the lithographic apparatus including an acoustic resonator to at least partly dampen an acoustical vibration in the lithographic apparatus.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate and an acoustic resonator configured to at least partly dampen an acoustical vibration in the lithographic apparatus.

According to an embodiment of the invention, there is provided a device manufacturing method including patterning a beam of radiation to form a patterned beam of radiation; projecting the patterned beam of radiation onto a target portion of a substrate; and at least partly dampening an acoustical vibration during the projecting.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
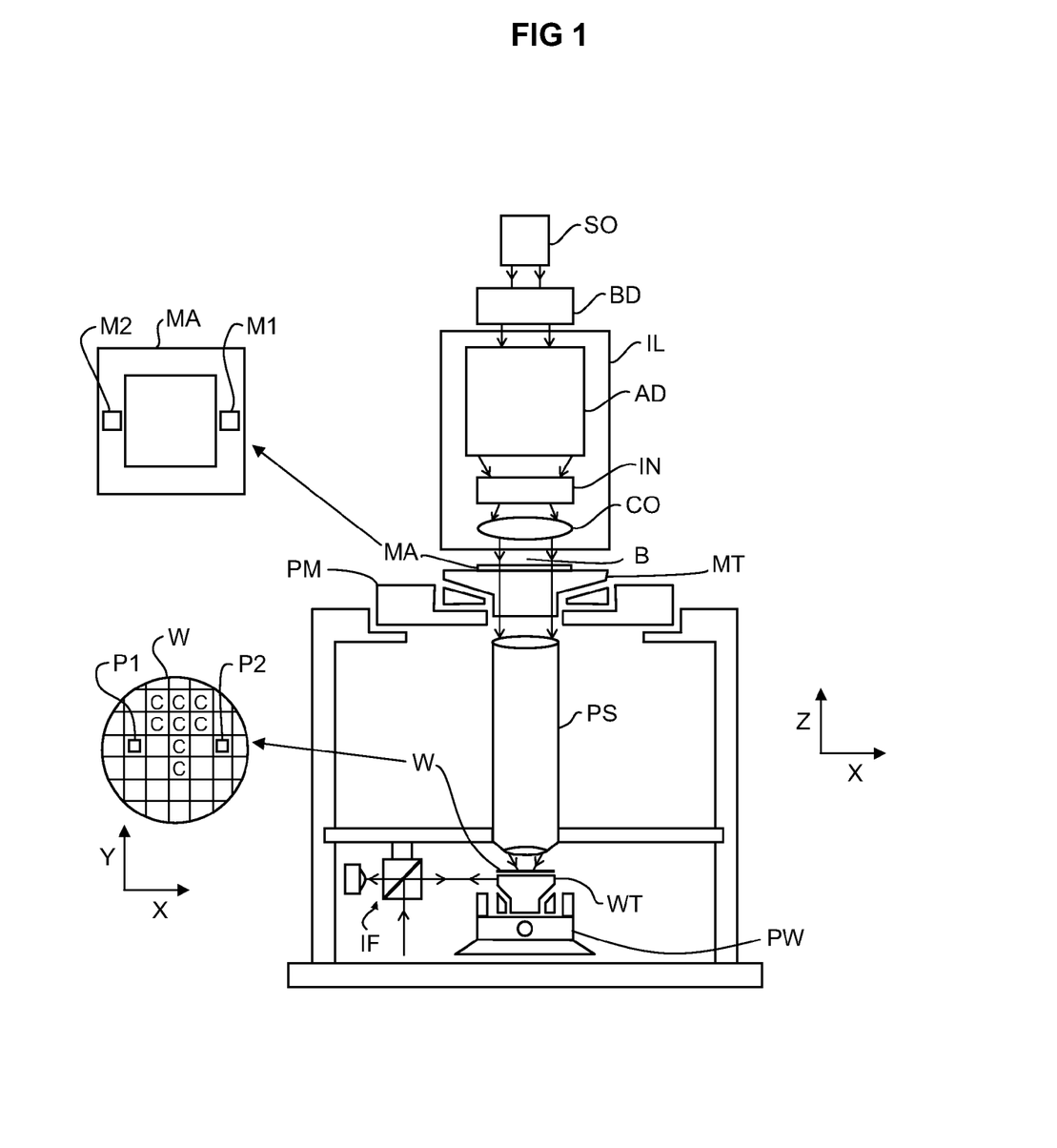
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters.

The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support or support structure holds the patterning device in a manner that depends on the orientation of the patterning device, the design of the lithographic apparatus, and other conditions, such as for example whether or not the patterning device is held in a vacuum environment. The patterning device support or support structure can use mechanical, vacuum, electrostatic or other clamping techniques to hold the patterning device. The patterning device support or support structure may be a frame or a table, for example, which may be fixed or movable as required. The patterning device support or support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander.

In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support or support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support or support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support or support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided on the patterning device (e.g. mask) MA, the mask alignment marks may be located between the dies.

The depicted apparatus could be used in at least one of the following modes:

1. In step mode, the patterning device support or support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support or support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support or support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support or support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
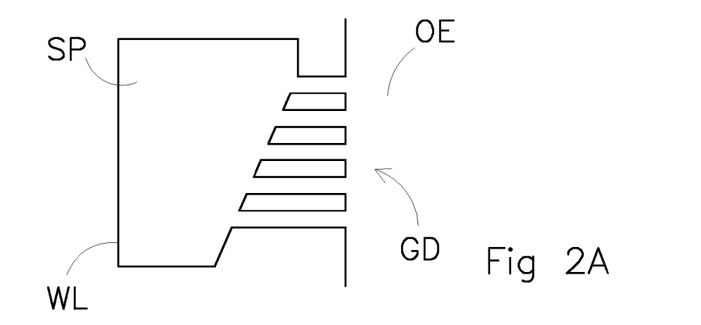
FIG. 2A-2C schematically depict various embodiments of a resonator to be applied in a lithographic apparatus according to an embodiment of the invention.
Figure 2B:
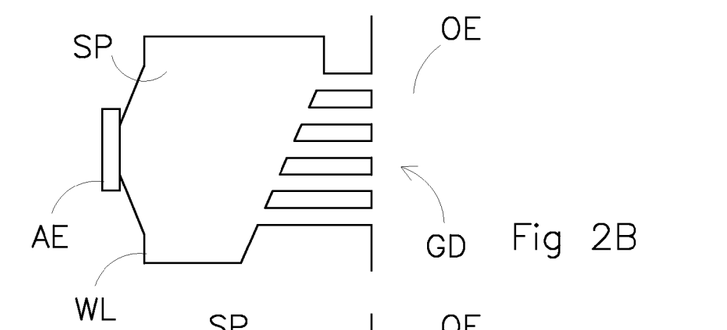
Figure 2C:
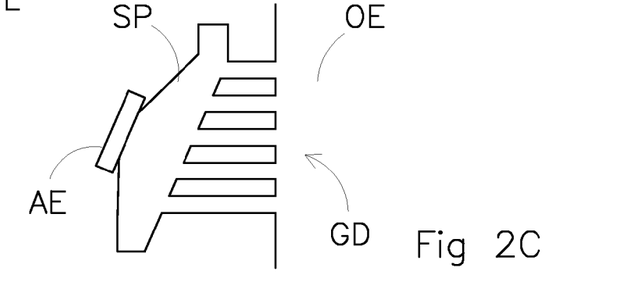

FIGS. 2A-2C depict cross sectional views of various embodiments of a resonator for use in a lithographic apparatus according to an embodiment of the invention. Dampening of an acoustic vibration may be performed during projection. In an embodiment, the acoustic resonator includes a Helmholtz resonator. FIG. 2A depicts a resonator including a plurality of gas ducts GD and a space SP. The gas ducts and the space may in operation be filled with a gas, such as, for example, air, cleaned air, ultra clean dried air, synthetic air, nitrogen, or any other gas or gas mixture. Alternatively, the gas ducts and the space may be filled with a vapor or any suitable liquid. The gas ducts provide a connection between the space SP and an outside environment OE of the resonator. As the space is enclosed by the wall WL, and only allows exchange of gas or other substance via the gas ducts, a system with spring-mass characteristics may be formed. The gas (or other) in the gas ducts GD thereby forms a mass, while the gas (or other) in the space SP forms a spring. When an acoustic vibration in the outside environment OE reaches an entrance of the gas ducts, a mass spring assembly is thereby excited, the mass being formed by the gas in the gas ducts, while the spring being formed by the gas in the space SP. When the acoustic vibration is in a resonance frequency area of the mass spring combination, reflection and/or damping of the vibration in the outside area will take place. In the embodiment shown here, a plurality of gas ducts have been provided wherein gas ducts having a different volume are provided (either by a different length, by a different diameter, height, or any other parameter), which results in various resonance frequencies for each of the mass spring combination that have been formed thereby. As a result thereof, acoustic vibration in a plurality of frequency ranges may be dampened by the acoustic resonator. The resonant frequency ranges of the mass spring combination may thereby be chosen such that a resonant range of partly overlapping or adjacent resonant frequency ranges is provided.

FIG. 2B again shows a resonator having a space SP and a plurality of gas ducts GD. In addition to the features and description provided above with the reference to FIG. 2A, the resonator shown in FIG. 2B includes an active element AE in the wall WL of the space SP. By driving the actuator AE with a suitable drive signal, an active mass damper system may be provided, as the active element (such as a loud speaker) may be applied to actively change the volume of the space SP and/or to actively damp the spring formed by the gas in the space SP.

The active element AE may be formed by any suitable actuator, such as a piezoelectric loud speaker, dynamic loud speaker, etc. The active element may be driven by a control device (not shown) which is provided with a signal from a vibration sensor, such as a microphone, positioned to sense an acoustic vibration in the outside environment OE. It is noted that the active element may be applied in two ways: as stated above, changing the spring constant of the spring or adding damping by the active volume change of the space, however alternatively or in addition thereto it is also possible that the active element provides for an active counter operating when driven with an appropriate phase relation with respect to the vibration in the space, to thereby dampen the vibration. The sensor, instead of being positioned to sense a vibration in the outside environment OE, it may also be positioned to sense a vibration in the space SP itself.

A further example of an acoustic resonator is provided in FIG. 2C, which provides a set up similar to FIG. 2B, however a volume of the space SP has been drastically reduced. The set up shown in FIG. 2C thereby essentially provides an active damping, where the mass of the resonator is formed by the mass of the gas in the gas duct, while the spring is largely formed by the active operation of the active element AE, as explained above. The configuration shown in FIG. 2C may thereby thus be applied to provide an active damping. A benefit of the configuration according to FIG. 2C is that it allows an adaptation of the spring characteristic over a wide range, by an appropriate driving of the active element, which thereby allows to adapt a desired characteristic of the resonator by a suitable driving of the active element. In this case, the active element and its control could be configured such that pressure variations in the space SP as a result of acoustical input are reduced. This way, the small space SP with the active element behaves like a large space SP. To drive the active element AE, the controller may use pressure information from a pressure sensor or microphone positioned inside the space SP, or positioned outside SP, in the open area OA.

In the configuration shown in FIGS. 2A-2C, instead of the plurality of gas ducts having a different length, use may be made of a single gas duct, of a plurality of gas ducts having different height, diameter, etc to thereby obtain a resonance frequency range or a plurality of resonance frequency range as desired. To increase a resonance frequency range, i.e. to make a resonator less frequency selective, one or more of the gas ducts may be provided with an acoustical resistance, such as by providing roughened or at least partly ribbed walls of the gas ducts or by adding acoustic damping or absorption material. Thereby, resistance and damping is introduced in the mass spring combination which flattens a resonance frequency characteristic thereof.

Figure 3:
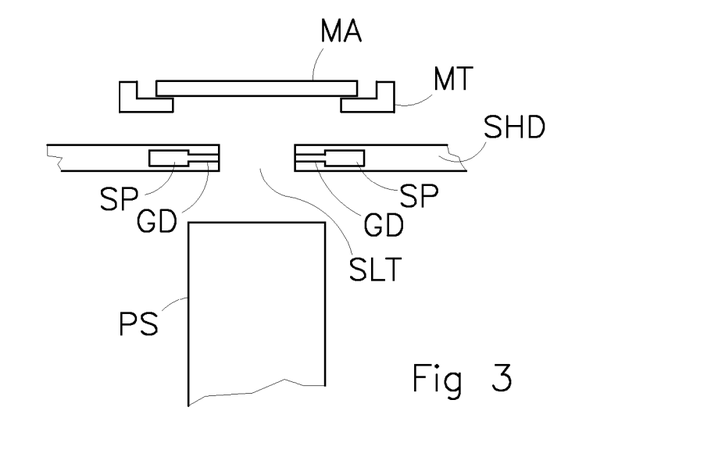
FIG. 3 depicts a schematic view of a support, shield and projection system of a lithographic apparatus according to an embodiment of the invention.

FIG. 3 depicts a highly schematic view of patterning device support MT holding a patterning device MA. A patterned beam may be projected via the projection system PS on to the substrate. A shield SHD is provided between the support MT and the projection system PS, to thereby shield the projection system for disturbances (vibrations, pressure, waves, etc) e.g. caused by a movement of the patterning device support MT and patterning device MA, towards the projection system PS. A slit SLT is provided in the shield SHD to allow passage of the patterned beam to the projection system PS. To at least reduce a transfer of such vibrations, pressure waves or others via de slit SLT to the projection system PS, an acoustic resonator is provided at the slit. In this embodiment, the resonator is provided in the shield SHD, on both sides of the slit SLT, and each of the resonators includes one or more gas ducts GD and a space SP, thereby providing a resonator of the type shown in FIG. 2A. The frequency component(s) of the vibration, pressure, wave, etc being in or near the resonance arrange of the resonator, are suppressed, reduced or reflected by excitation of the resonator(s). Thereby, an effect on the projection system, in particular on an optical element, such as a lens element, mirror element, etc thereof, may be at least reduced.

Figure 4:
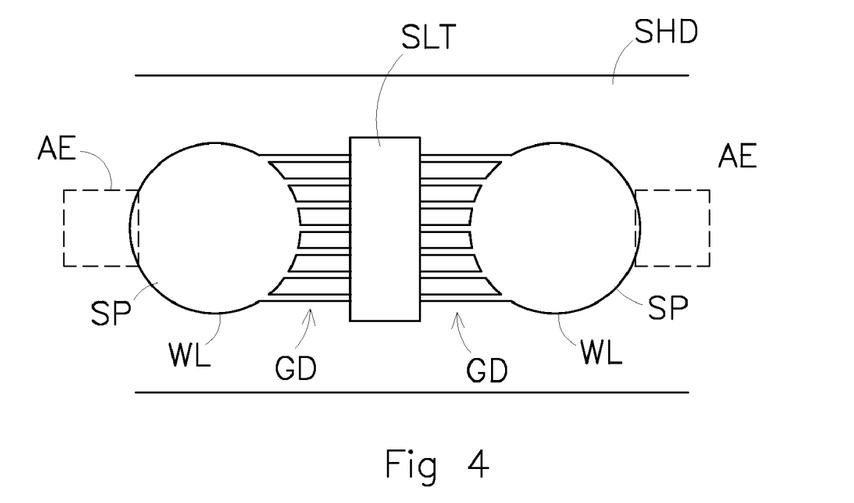
FIG. 4 depicts a highly schematic cross sectional top view of the shield according to FIG. 3.

FIG. 4 shows top view of the shield SHD depicted in FIG. 3. As depicted in FIG. 4, the resonators each include a plurality of gas ducts connected to the respective space SP. By providing a resonator on both sides of the slit SLT, a more symmetric suppression of acoustical disturbances may be achieved. A possible benefit of the guiding ducts having different lengths has been explained above with reference to FIG. 2A. As already explained with reference to FIG. 2B, an active element AE may be provided as forming part of the surrounding wall WL of each of the spaces SP of the resonators, thereby possibly achieving one or more of the effects as explained with reference to FIG. 2B. A vibration sensor, such as a microphone may be positioned near the slit SLT to sense acoustical disturbances towards the slit SLT. The sensor may also be placed in the space SP. Alternatively to the setup according to FIG. 4, the resonators in the shield SHD may be of a type as depicted and described with reference to FIG. 2-C, instead of the types depicted in and described with reference to FIGS. 2A and 2B respectively.

Figure 5:
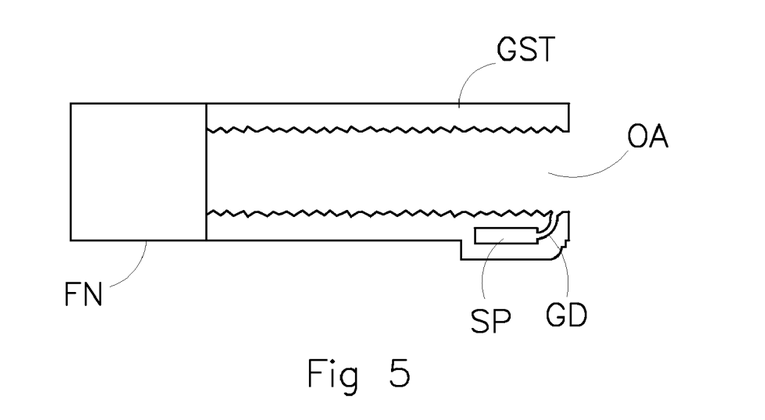
FIG. 5 depicts a schematic view of gas supply tube of a lithographic apparatus according to an embodiment of the invention.

FIG. 5 shows a schematic example of gas supply tube GST of a lithographic apparatus, the gas supply tube configured to provide gas or gas mixture via an outlet area OA to a part of the lithographic apparatus. As an example, a highly clean gas may be provided to sensitive areas of the lithographic apparatus, cooling may be provided by a fast gas stream, etc. Although in FIG. 5 a highly schematic, straight gas supply tube GST has been depicted, the gas supply tube may have any length, diameter, shape, outline, etc. FIG. 5 further schematically indicates a propelling device FN, such as a fan, pump, or other device to provide a flow of the gas in the gas supply tube GST. FIG. 5 depicts a resonator, including a guiding duct GD and a space SP (of a type shown in and depicted with reference to FIG. 2A), the resonator being provided in a wall of the gas supply tube and near the outlet area OA thereof. The resonator may aid in reducing and reflecting of vibrations, pressure waves, or other acoustical effects from the output area of the gas supply tube. Such vibrations, pressure waves, etc may have been generated by a variety of causes, such as by the propelling device FN, by a ribbed surface at the inside of the gas supply tube, or by any other cause. It will be appreciated that in the example shown in FIG. 5, instead of the resonator depicted in and described with reference to FIG. 2A, the resonators according to FIGS. 2B, 2C or other may be applied.

Figure 6:
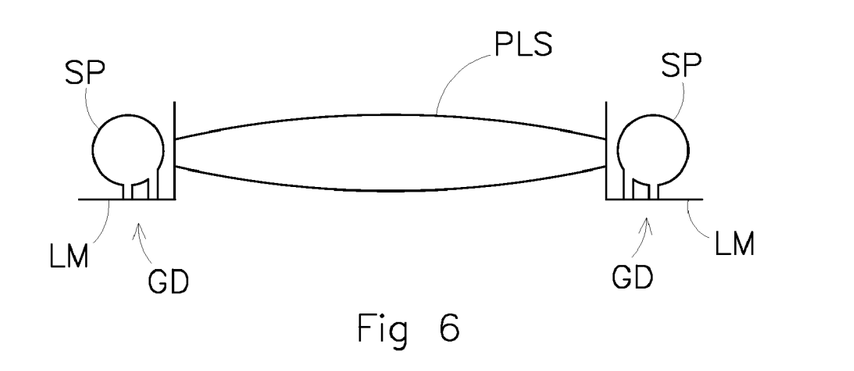
FIG. 6 depicts a schematic view of a downstream projection lens and lens mount of a lithographic apparatus according to an embodiment of the invention.

FIG. 6 shows a schematic view of a projection lens PLS, such as a downstream projection lens of the projection system PS. A lens mount of which part has been shown in a cross sectional view, is provided with a resonator, in this example of the type show in FIG. 2. The resonator includes gas ducts towards an outside environment of the lens mount, and a space provided in the lens mount. In FIG. 6, a resonator has been shown on two sides of the projection lens PLS. It will be understood that a plurality of such resonators may be provided circumferring the lens, to achieve a suppression of acoustical effects onto the lens in a geometrically advantageous manner. By suppressing such acoustical effect (vibrations, pressure waves, etc), an effect thereof on the projection lens PLS may be reduced which may result in an improved accuracy of the projection by the projection lens PLS of the pattern beam onto the substrate. It will be appreciated that instead of the resonator principle shown in FIG. 2A, other resonators such as the ones depicted in FIG.(S) 2-B and/or 2-C may be applied.

Where in this document the term acoustic vibration is mentioned, this is to be understood as to include any kind of acoustical effect, such as an acoustical pressure wave, acoustical vibration, acoustical shock, etc. Also, the term acoustic vibration is to be understood as to include a vibration in any medium, such as in a gas, liquid and/or solid. Thus, in this document, the term acoustic vibration may contain any vibration pattern, e.g. sinusoidal, shock wave, burst, pulse, etc, and in any frequency range. It is thus emphasized that the term acoustic vibration is not to be understood as being limited to sound waves that are audible to the human ear.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus arranged to transfer a pattern from a patterning device onto a substrate, the lithographic apparatus comprising:
   a shield having an opening to allow passage of a radiation beam; and
   an acoustic resonator acoustically connected to the opening to at least reduce a transfer of acoustical vibrations passing through the opening,
   wherein the acoustic resonator is arranged in the shield and includes a space to hold a gas, the space being enclosed by a surrounding wall, and a gas duct discharging into the space.

2. The lithographic apparatus according to claim 1, wherein the acoustic resonator comprises a Helmholtz resonator.

3. The lithographic apparatus according to claim 2, wherein the Helmholtz resonator comprises a plurality of gas ducts discharging into the space, the gas ducts having different volumes.

4. The lithographic apparatus according to claim 3, wherein a wall of the ducts is at least partly ribbed or roughened to provide acoustical resistance in the ducts.

5. The lithographic apparatus according to claim 3, wherein at least a part of the surrounding wall of the space is formed by an active element, the active element being able to be driven so as to provide a displacement thereof resulting in a change of volume of the space.

6. The lithographic apparatus according to claim 1, comprising:
   an illumination system configured to condition the radiation beam;
   a support constructed to support a patterning device, the patterning device being capable of imparting the radiation beam with the pattern in its cross-section to form a patterned radiation beam;
   a substrate table constructed to hold a substrate;
   a projection system configured to project the patterned radiation beam onto a target portion of the substrate;
   wherein the shield is arranged between the support and the projection system.

7. The lithographic apparatus according to claim 6, wherein the acoustic resonator comprises a Helmholtz resonator.

8. The lithographic apparatus according to claim 7, wherein the Helmholtz resonator comprises a plurality of gas ducts discharging into the space, the gas ducts having different volumes.

9. The lithographic apparatus according to claim 8, wherein a wall of the ducts is at least partly ribbed or roughened to provide acoustical resistance in the ducts.

10. The lithographic apparatus according to claim 8, wherein at least a part of the surrounding wall of the space is formed by an active element, the active element being able to be driven so as to provide a displacement thereof resulting in a change of volume of the space.

11. The lithographic apparatus according to claim 1, comprising a gas supply tube configured to guide a gas to a part of the lithographic apparatus, and another acoustical resonator being acoustically connected to an outlet of the gas supply tube to at least partly dampen an acoustical vibration transferred via the gas supply tube.

12. The lithographic apparatus according to claim 11, wherein the other acoustic resonator comprises a Helmholtz resonator.

13. The lithographic apparatus according to claim 12, wherein the Helmholtz resonator comprises a space to hold a gas, the space being enclosed by a surrounding wall, the Helmholtz resonator further comprising a plurality of gas ducts discharging into the space, the gas ducts having different volumes.

14. The lithographic apparatus according to claim 13, wherein a wall of the ducts is at least partly ribbed or roughened to provide acoustical resistance in the ducts.

15. The lithographic apparatus according to claim 13, wherein at least a part of the surrounding wall of the space is formed by an active element, the active element being able to be driven so as to provide a displacement thereof resulting in a change of a volume of the space.

16. The lithographic apparatus according to claim 1, wherein the acoustic resonator has an outlet facing toward the opening.

17. The lithographic apparatus according to claim 1, wherein the radiation beam is patterned with said pattern.

18. The lithographic apparatus according to claim 1, wherein the acoustic resonator is configured to reduce a transfer of acoustical vibrations from one side of the shield to an opposite side of the shield.

19. A lithographic apparatus, comprising:
   a support constructed to support a patterning device, the patterning device being capable of imparting a radiation beam with a pattern in its cross-section to form a patterned radiation beam;
   a substrate table constructed to hold a substrate;

a projection system configured to project the patterned radiation beam onto a target portion of the substrate;

an acoustic resonator configured to at least partly dampen an acoustical vibration in the lithographic apparatus, the acoustic resonator comprising a Helmholtz resonator; and a shield arranged between the support and the projection system, the shield having an opening to allow passage of the patterned radiation beam, the acoustic resonator being acoustically connected to the opening to at least reduce a transfer of acoustical vibrations via the opening, wherein the Helmholtz resonator comprises a space to hold a gas, the space being enclosed by a surrounding Wall, the Helmholtz resonator further comprising a plurality of gas ducts discharging into the space, the gas ducts having different volumes, and wherein the space and the ducts are comprised in the shield.

20. A lithographic apparatus, comprising:

a support constructed to support a patterning device, the patterning device being capable of imparting a radiation beam with a pattern in its cross-section to form a patterned radiation beam;

a substrate table constructed to hold a substrate;

a projection system configured to project the patterned radiation beam onto a target portion of the substrate, and an acoustical resonator arranged to dampen an acoustical vibration of an optical element of the projection system, wherein the resonator is arranged in a mount of the optical element.

21. The lithographic apparatus according to claim 20, wherein the acoustic resonator comprises a Helmholtz resonator.

22. The lithographic apparatus according to claim 21, wherein the Helmholtz resonator comprises a space to hold a gas, the space being enclosed by a surrounding wall, the Helmholtz resonator further comprising a plurality of gas ducts discharging into the space, the gas ducts having different volumes.

23. The lithographic apparatus according to claim 22, wherein a wall of the ducts is at least partly ribbed or roughened to provide acoustical resistance in the ducts.

24. The lithographic apparatus according to claim 22, wherein at least a part of the surrounding wall of the space is formed by an active element, the active element being able to be driven so as to provide a displacement thereof resulting in a change of volume of the space.

25. The lithographic apparatus according to claim 20, wherein the optical element is a downstream optical element.

* * * * *